(12) United States Patent
Hashimoto et al.

(10) Patent No.: US 11,715,650 B2
(45) Date of Patent: Aug. 1, 2023

(54) SUBSTRATE PROCESSING APPARATUS AND MANUFACTURING METHOD THEREFOR

(71) Applicant: Tokyo Electron Limited, Tokyo (JP)

(72) Inventors: Yusuke Hashimoto, Koshi (JP); Jiro Higashijima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/984,386

(22) Filed: Aug. 4, 2020

(65) Prior Publication Data
US 2021/0043467 A1 Feb. 11, 2021

(30) Foreign Application Priority Data
Aug. 9, 2019 (JP) .................................. 2019-147949

(51) Int. Cl.
*H01L 21/67* (2006.01)
(52) U.S. Cl.
CPC ................................ *H01L 21/6708* (2013.01)
(58) Field of Classification Search
None
See application file for complete search history.

(56) References Cited

U.S. PATENT DOCUMENTS

| | | | | |
|---|---|---|---|---|
| 5,002,008 A | * | 3/1991 | Ushijima | B05B 15/55 118/313 |
| 5,584,971 A | * | 12/1996 | Komino | C23C 16/46 204/192.13 |
| 5,756,155 A | * | 5/1998 | Tzeng | B05B 14/00 239/113 |
| 6,244,519 B1 | * | 6/2001 | Hayakawa | B23K 9/325 239/83 |
| 2008/0251107 A1 | * | 10/2008 | Osada | H01L 21/67051 134/201 |
| 2011/0068200 A1 | * | 3/2011 | Kim | H01L 21/67051 239/589 |
| 2017/0059996 A1 | * | 3/2017 | Higashijima | G03F 7/423 |
| 2017/0096326 A1 | * | 4/2017 | Nasman | B05C 5/0225 |
| 2018/0126392 A1 | * | 5/2018 | Moser | A61B 17/3203 |
| 2018/0361403 A1 | * | 12/2018 | Grund | B05B 1/3033 |
| 2020/0168478 A1 | * | 5/2020 | Jung | H01L 21/67051 |
| 2021/0043467 A1 | * | 2/2021 | Hashimoto | H01L 21/6708 |

FOREIGN PATENT DOCUMENTS

JP 2013-207080 A 10/2013
WO WO-2013117633 A1 * 8/2013 ............... B05B 1/28

* cited by examiner

*Primary Examiner* — Sylvia MacArthur
(74) *Attorney, Agent, or Firm* — Pearne & Gordon LLP

(57) ABSTRACT

A substrate processing apparatus includes a nozzle unit. The nozzle unit includes a line and a nozzle tip provided on a tip end of the line. The line includes a first layer, a second layer and a third layer. The nozzle tip is formed of a corrosion resistant resin having conductivity. The third layer is configured to cover the first layer and the second layer from outside and cover a part of the nozzle tip from outside.

10 Claims, 6 Drawing Sheets

SUBSTRATE PROCESSING APPARATUS AND MANUFACTURING METHOD THEREFOR

CROSS-REFERENCE TO RELATED APPLICATION

This application claims the benefit of Japanese Patent Application No. 2019-147949 filed on Aug. 9, 2019, the entire disclosure of which is incorporated herein by reference.

TECHNICAL FIELD

The exemplary embodiments described herein pertain generally to a substrate processing apparatus and a manufacturing method therefor.

BACKGROUND

In a manufacturing process of a semiconductor device, a processing, such as etching or ion implantation, is performed with a resist formed on a substrate as a mask. Then, the resist, which is no longer necessary, is removed from the substrate.

As a removing method of the resist, there is known an SPM process of removing the resist by supplying an SPM (Sulfuric acid Hydrogen Peroxide Mixture), which is a mixed solution of sulfuric acid and hydrogen peroxide, onto the substrate. To enhance the resist removal capability of the SPM, the SPM is supplied onto the substrate from a nozzle unit in a state where the SPM is heated to a high temperature (see, for example, Patent Document 1).

Patent Document 1: Japanese Patent Laid-open Publication No. 2013-207080

SUMMARY

In one exemplary embodiment, a substrate processing apparatus includes a substrate holding mechanism configured to hold a target substrate; and a nozzle unit configured to discharge a processing liquid to the target substrate held by the substrate holding mechanism. The nozzle unit includes a line through which the processing liquid is supplied and a nozzle tip provided on a tip end of the line and configured to discharge the processing liquid toward the target substrate. The line includes a first layer formed of a corrosion resistant resin, a second layer formed of a rigid material and a third layer formed of a corrosion resistant resin which are arranged in sequence from an inside thereof. The nozzle tip is formed of a corrosion resistant resin having conductivity. The third layer is configured to cover the first layer and the second layer from outside and cover a part of the nozzle tip from outside.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
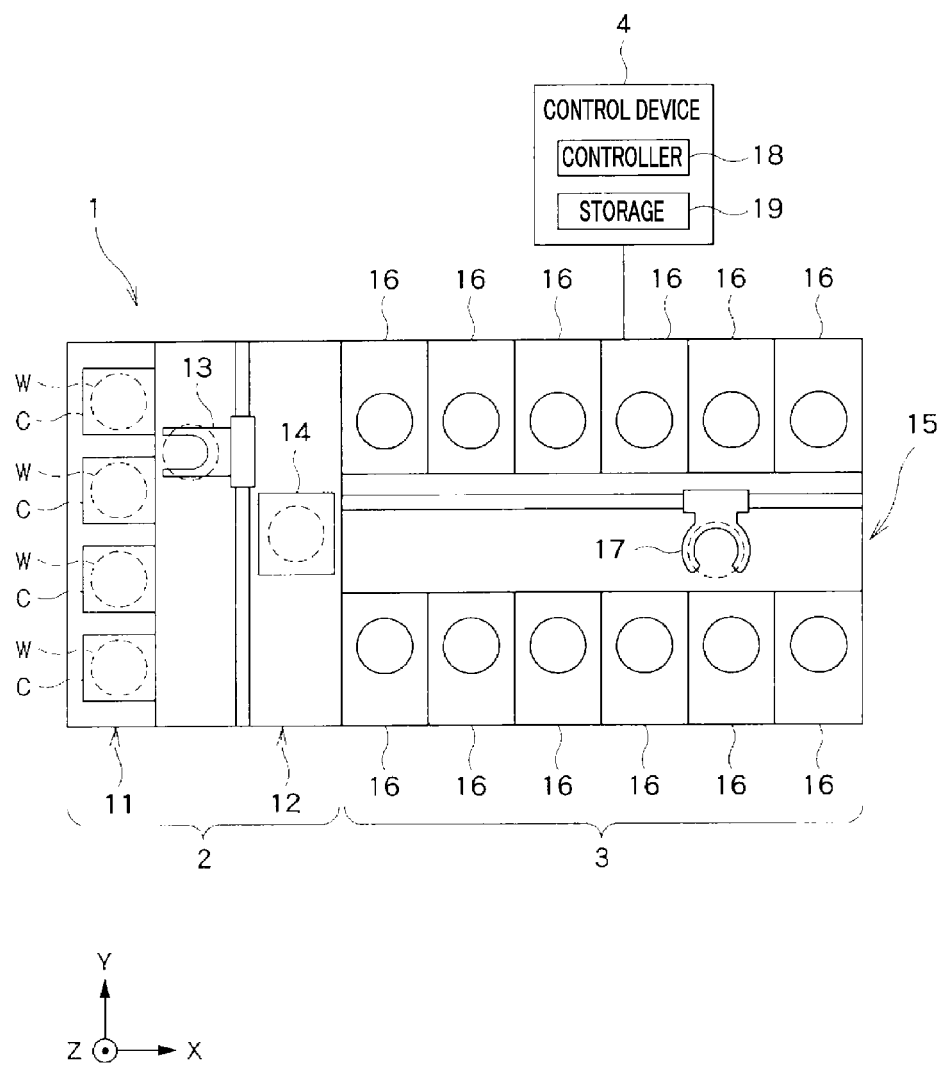
FIG. 1 is a diagram schematically illustrating a configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Exemplary Embodiment of Present Disclosure

Hereinafter, an exemplary embodiment of a substrate processing apparatus of the present disclosure will be describe in detail. The present disclosure is not limited to the following exemplary embodiment.

Further, hereinafter, there will be described an example where a processing liquid is an SPM (Sulfuric acid Hydrogen Peroxide Mixture) which is a mixed solution of sulfuric acid and hydrogen peroxide.

FIG. 1 is a diagram schematically illustrating a configuration of a substrate processing system according to an exemplary embodiment. In the following, in order to clarify positional relationships, the X-axis, Y-axis and Z-axis which are orthogonal to each other will be defined, and the positive Z-axis direction will be regarded as a vertically upward direction.

As illustrated in FIG. 1, a substrate processing system 1 includes a carry-in/out station 2 and a processing station 3.

The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to accommodate therein a plurality of substrates, e.g., semiconductor wafers W (hereinafter, referred to as "wafers W"), horizontally.

The transfer section 12 is provided adjacent to the carrier placing section 11 and equipped with a substrate transfer device 13 and a delivery unit 14 therein. The substrate transfer device 13 is equipped with a wafer holding mechanism configured to hold a wafer W. Further, the substrate transfer device 13 is movable in a horizontal direction and a vertical direction and pivotable around a vertical axis, and transfers the wafer W between the carriers C and the delivery unit 14 by using the wafer holding mechanism.

The processing station 3 is provided adjacent to the transfer section 12. The processing station 3 is equipped with a transfer section 15 and a plurality of processing units (substrate processing apparatuses according to the present disclosure) 16. The plurality of processing units 16 is arranged on both sides of the transfer section 15.

The transfer section 15 is equipped with a substrate transfer device 17 therein. The substrate transfer device 17 is equipped with a wafer holding mechanism configured to hold the wafer W. Further, the substrate transfer device 17 is movable in the horizontal direction and the vertical direction and pivotable around a vertical axis, and transfers the wafer W between the delivery unit 14 and the processing units 16 by using the wafer holding mechanism.

Each processing unit 16 is configured to perform a predetermined substrate processing on the wafer W transferred by the substrate transfer device 17.

Further, the substrate processing system 1 is equipped with a control device 4. The control device 4 includes, for example, a computer and includes a controller 18 and a storage 19. The storage 19 stores a program that controls various processings performed in the substrate processing system 1. The controller 18 controls the operations of the substrate processing system 1 by reading and executing the program stored in the storage 19.

Furthermore, the program may be recorded in a computer-readable storage medium and installed from the storage medium to the storage 19 of the control device 4. The computer-readable storage medium includes, for example, a hard disk (HD), a flexible disk (FD), a compact disk (CD), a magneto-optical disk (MO), and a memory card.

In the substrate processing system 1 configured as described above, the substrate transfer device 13 of the carry-in/out station 2 first takes out a wafer W from a carrier C placed in the carrier placing section 11 and then places the wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16 and then carried out from the processing unit 16 to be placed on the delivery unit 14 by the substrate transfer device 17. After processed and placed on the delivery unit 14, the wafer W is returned to the carrier C of the carrier placing section 11 by the substrate transfer device 13.

Figure 2:
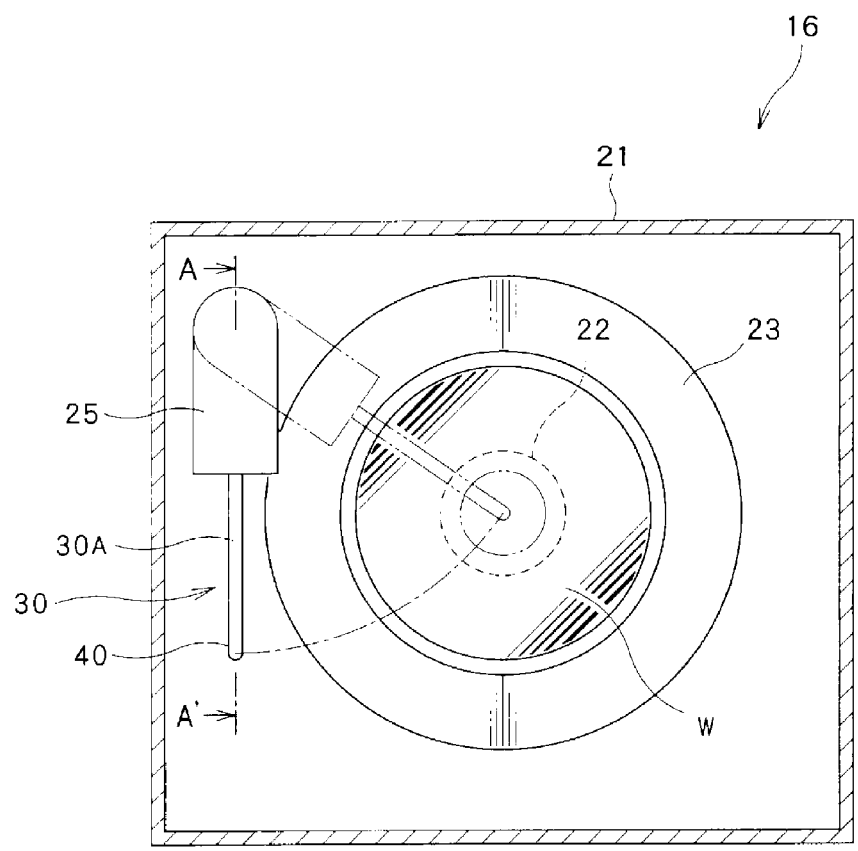
FIG. 2 is a plan view illustrating a configuration of a processing unit (substrate processing apparatus)

Hereinafter, a schematic configuration of the processing unit (substrate processing apparatus according to the present disclosure) 16 will be described with reference to FIG. 2. FIG. 2 is a plan view illustrating a configuration of the processing unit 16.

As illustrated in FIG. 2, the processing unit (substrate processing apparatus) 16 is equipped with a chamber 21, a substrate holding mechanism 22 placed within the chamber 21 and configured to rotatably hold a wafer W, a recovery cup 23 and a nozzle unit 30 configured to discharge a processing liquid to the wafer W.

Particularly, the substrate holding mechanism 22 horizontally holds the wafer W and also rotates the wafer W held thereon around a vertical axis. Also, the recovery cup 23 is placed to surround the substrate holding mechanism 22 and configured to collect the processing liquid which is scattered to the outside from the wafer W by a centrifugal force generated when the substrate holding mechanism 22 is rotated.

The nozzle unit 30 is placed within the chamber 21 and configured to supply the processing liquid toward the wafer W from above the wafer W. This nozzle unit 30 includes a line 30A through which the processing liquid is supplied; a nozzle tip 40 provided on a tip end of the line 30A and configured to discharge the processing liquid toward the wafer W; and a nozzle support 25 configured to hold the line 30A of the nozzle unit 30, and the nozzle support 25 is movable up and down and pivotable.

Hereinafter, a structure of the nozzle unit 30 will be described in detail with reference to FIG. 2 and FIG. 3A to FIG. 3C.

As illustrated in FIG. 2 and FIG. 3A to FIG. 3C, the nozzle unit 30 is equipped with the line 30A configured to supply the processing liquid, the nozzle tip 40 provided on the tip end of the line 30A and the nozzle support 25 configured to support the line 30A such that the line 30A is movable up and down and pivotable, and the nozzle unit 30 is configured to discharge the SPM toward the wafer W.

Herein, if the SPM is used to remove, for example, a resist, the SMP is discharged from the nozzle tip 40 toward the wafer W at a high temperature of about 160° C.

The nozzle unit 30 will be described in more detail. The line 30A of the nozzle unit 30 is formed into an L-shape when viewed from the side, and includes a first layer 31 formed of a corrosion resistant resin, a second layer 32 formed of a rigid material and a third layer 33 formed of a corrosion resistant resin which are arranged in sequence from the inside thereof. Further, the nozzle tip 40 of the nozzle unit 30 is configured as a separate body from the line 30A. Moreover, the nozzle tip 40 is configured to be inserted into the tip end of the line 30A and formed of a corrosion resistant resin having conductivity.

Specifically, the first layer 31 of the line 30A may be formed using a thermoplastic material having chemical resistance against the SPM and heat resistance, for example, a PFA (tetrafluoroethylene perfluoroalkylvinylether) tube having conductivity.

Also, the second layer 32 may be formed using an SUS (stainless steel) tube which functions as a frame for maintaining rigidity of the line 30A and has conductivity.

Further, the third layer 33 may be formed using a thermoplastic material having chemical resistance against the SPM and heat resistance, for example, a PFA tube.

Furthermore, the nozzle tip 40 may be formed using a PFA material having conductivity.

Figure 3A:
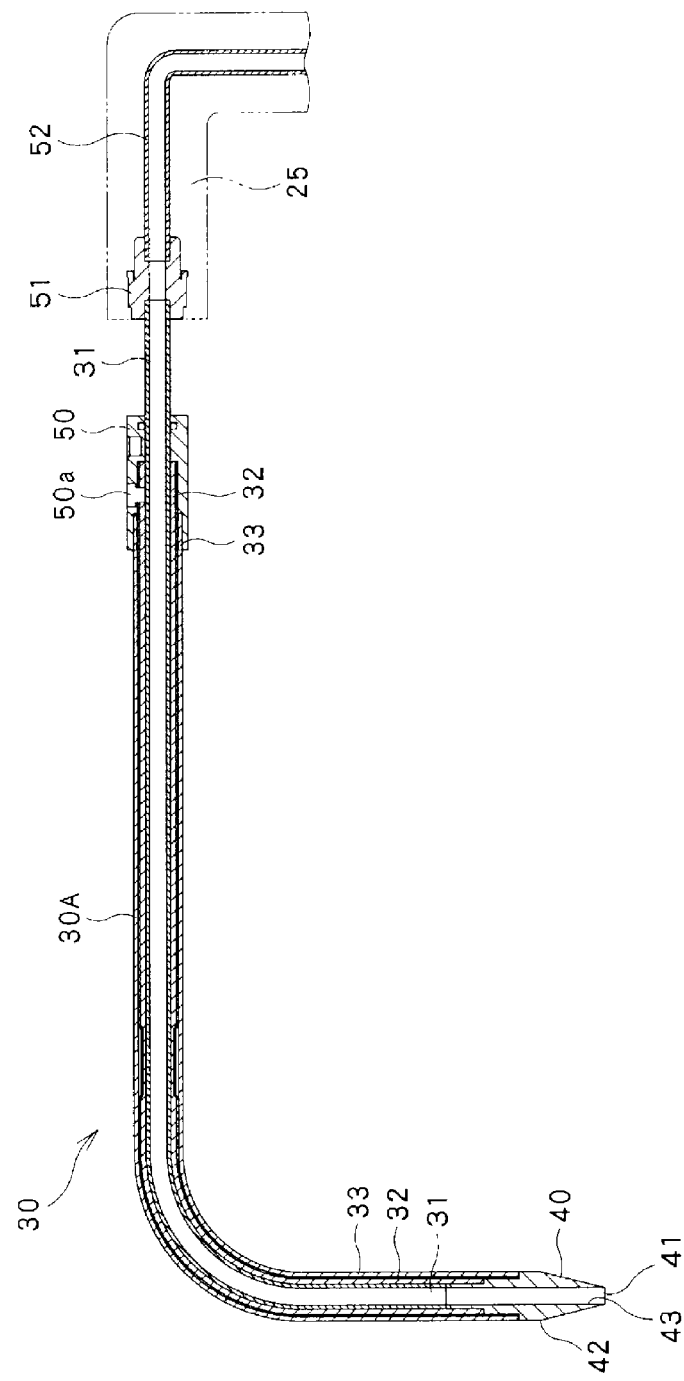
FIG. 3A is a side cross-sectional view illustrating a nozzle unit according to the present exemplary embodiment as taken along a line A-A' of FIG. 2.
Figure 3B:
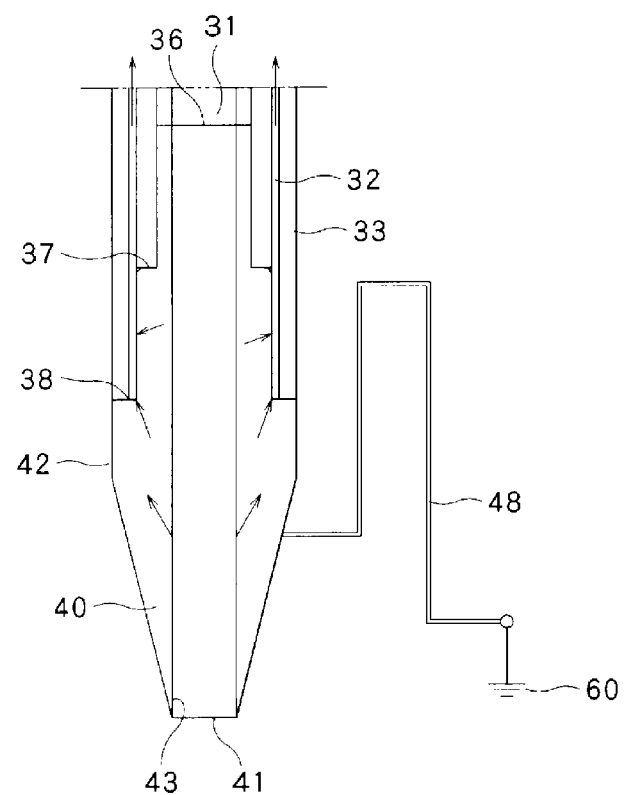
FIG. 3B is an enlarged view showing charge neutralization.
Figure 3C:
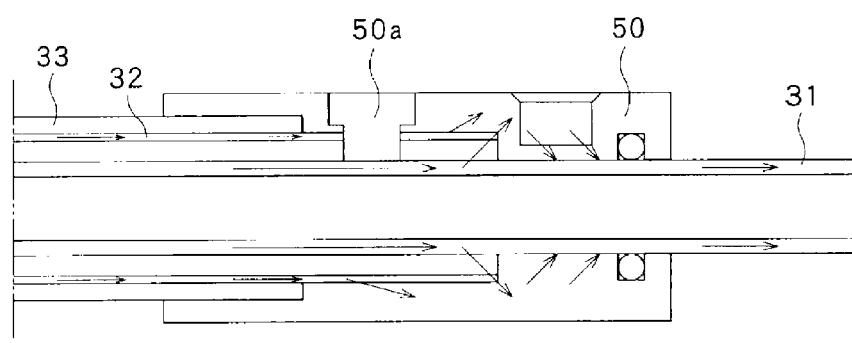
FIG. 3C is an enlarged view showing the charge neutralization.

As illustrated in FIG. 3A to FIG. 3C, the nozzle unit 30 also includes a conductor 50 which is provided at a base end side of the line 30A and has conductivity. Further, a connector 51 formed of, for example, a PFA material having conductivity, is provided at a base end of the line 30A. Further, the line 30A is inserted into and mounted on the nozzle support 25 via the connector 51 provided at the base end thereof and having conductivity. In this case, the nozzle support 25 has conductivity, and the line 30A is inserted into and mounted on the nozzle support 25 having conductivity via the connector 51 in a detachable manner. Therefore, a new line 30A and a nozzle tip 40 can be inserted into and mounted on the nozzle support 25, and, thus, the line 30A and the nozzle tip 40 can be easily replaced.

The conductor 50 provided at the base end side of the line 30A is configured to seal and cover the line 30A from the outside. Further, in the line 30A covered by the conductor 50, a part of the second layer 32 is removed, and at a portion of the conductor 50 where the second layer 32 is removed, a mounting member 50a configured to mount the conductor 50 on the line 30A is provided.

Further, at a portion of the line 30A covered by the conductor 50, an outer surface of the first layer 31 of the line 30A having conductivity is electrically connected to the conductor 50.

In this case, as illustrated in FIG. 3A and FIG. 3C, the first layer 31 of the line 30A penetrates the conductor 50 to be extended toward the base end side (toward the right side in FIG. 3A) to form the base end of the line 30A, and the connector 51 having conductivity is mounted on a base end of the first layer 31.

Furthermore, the second layer 32 is extended within the conductor 50 toward the base end side of the line 30A (toward the right side in FIG. 3A), and passes on the right side of the mounting member 50a within the conductor 50 and ends toward the right side in FIG. 3C.

Moreover, the third layer 33 is extended within the conductor 50 toward the base end side of the line 30A (toward the right side in FIG. 3A) and ends in front of (at the left side in FIG. 3C) the mounting member 50a within the conductor 50.

Figure 5A:
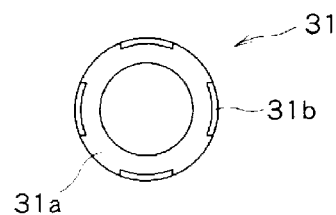
FIG. 5A is a cross-sectional view illustrating an example of a first layer.

Hereinafter, materials and structures of the first layer 31 to the third layer 33 of the line 30A and the nozzle tip 40 will be described in more detail. The first layer 31 of the line 30A is formed of a PFA tube having conductivity as described above. For example, the first layer 31 may be formed of a PFA tube of an NE (Non Explosion) type (simply, "NE type PFA tube"), as illustrated in FIG. 5A. The first layer 31 formed of the NE type PFA tube includes a tube main body 31a formed of a PFA material; and four conductors 31b formed of carbon and provided at an outer surface of the tube main body 31a formed of the PFA material to be extended in a longitudinal direction of the tube main body 31a. The four conductors 31b are arranged separately from each other at a 90° interval along the circumferential direction of the outer surface of the tube main body 31a. Therefore, the first layer 31 has conductivity along the longitudinal direction of the outer surface thereof.

Also, the second layer 32 is formed of an SUS tube as described above and entirely has conductivity.

The third layer 33 is formed of the PFA tube as described above, and has chemical resistance against the SPM and heat resistance, but does not have conductivity. However, the third layer 33 is not limited thereto. The third layer 33 may be formed of the PFA tube and may have conductivity as well as the chemical resistance against the SPM and the heat resistance. In this case, charges in the processing liquid can be released to the outside by the third layer 33 as well as by the first layer 31 and the second layer 32.

Further, the nozzle tip 40 is inserted on a tip end side of the line 30A and basically provided as a separate body from the line 30A.

A tip end 41 of the nozzle tip 40 faces toward the wafer W. Further, as described below, at least an inner surface of the nozzle tip 40 has conductivity from the tip end 41 toward the line 30A and is configured to neutralize the charges of the processing liquid discharged from the tip end 41 of the nozzle tip 40 toward the wafer W to securely suppress charging of the processing liquid discharged toward the wafer W.

Figure 5B:
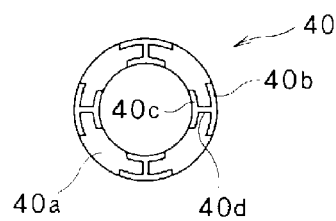
FIG. 5B is a cross-sectional view illustrating an example of a nozzle tip.

The nozzle tip 40 is formed of a PFA material having conductivity and may be formed of, for example, a PFA material of an AS (Anti-Static) type (simply, "AS type PFA material"), as illustrated in FIG. 5B. Specifically, as illustrated in FIG. 5B, the nozzle tip 40 includes a cylindrical main body 40a formed of the PFA material; four conductors 40b formed of carbon and provided at an outer surface 42 of the main body 40a to be extended in a longitudinal direction of the main body 40a formed of the PFA material; and four conductors 40c formed of carbon and provided at an inner surface 43 of the main body 40a to be extended in the longitudinal direction of the main body 40a.

In this case, the four conductors 40b are arranged separately from each other at a 90° interval along the circumferential direction of the outer surface 42 of the main body 40a, and the four conductors 40c are arranged separately from each other at a 90° interval along the circumferential direction of the inner surface 43 of the main body 40a. Further, the conductors 40b of the nozzle tip 40 are provided at the same positions in the circumferential direction with respect to the conductors 40c respectively corresponding thereto. Also, the conductors 40b are respectively connected to the corresponding conductors 40c via electrical conducting members 40d penetrating the main body 40a.

For this reason, the nozzle tip 40 has chemical resistance and heat resistance, and has conductivity in the longitudinal direction of the inner surface and outer surface thereof.

Further, as illustrated in FIG. 3B, the nozzle tip 40 is inserted at the tip end of the line 30A, but in this case, a tip end of the first layer 31 of the line 30A is contacted with a base end of the nozzle tip 40. Furthermore, the tip end of the first layer 31 and the base end of the nozzle tip 40 are welded together to form a joint portion 36. Also, the first layer 31 having conductivity on the outer surface and the nozzle tip 40 having conductivity on the outer surface can be electrically connected to each other via the joint portion 36.

Further, a tip end of the second layer 32 of the line 30A is extended to near the middle of the nozzle tip 40 to form a join portion 37 between the second layer 32 and the nozzle tip 40. Furthermore, the second layer 32 and the nozzle tip 40 having conductivity on the outer surface can be electrically connected to each other.

Also, a tip end of the third layer 33 of the line 30A is further extended from the second layer 32 to a tip end side of the nozzle tip 40, and the tip end of the third layer 33 and the nozzle tip 40 are welded together to form a joint portion 38.

In FIG. 3B, the nozzle tip 40 having conductivity on the inner surface thereof can neutralize the charges of the processing liquid passing through the inner surface. In the nozzle tip 40 also having conductivity on the outer surface thereof, the outer surface can be electrically connected to the outer surface of the first layer 31 via the joint portion 36. Further, the outer surface of the nozzle tip 40 can be electrically connected to the second layer 32.

Figure 3D:
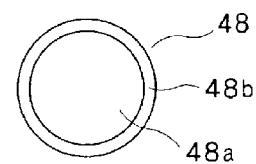
FIG. 3D is a cross-sectional view illustrating a conducting wire.
Figure 4:
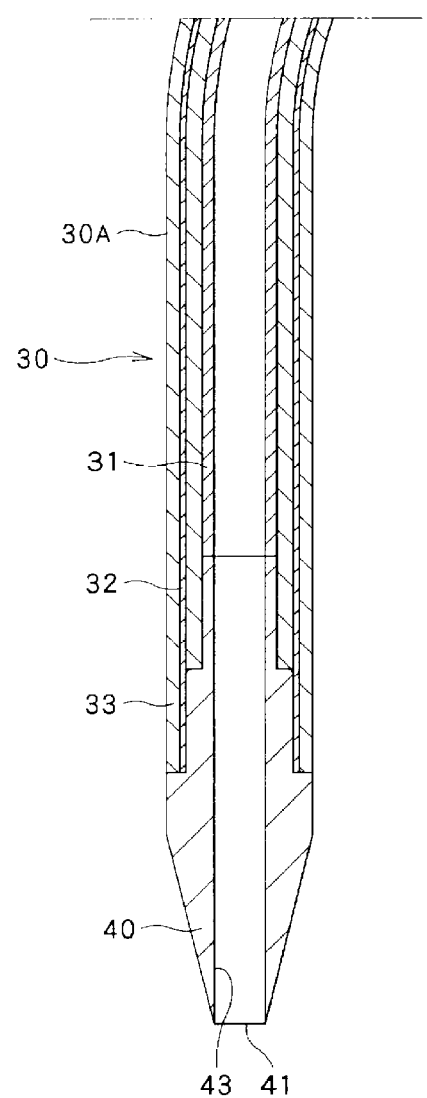
FIG. 4 is an enlarged view illustrating a tip end portion of the nozzle unit.

Moreover, a conducting wire 48 electrically connected to the nozzle tip 40 and configured to neutralize the charges of the processing liquid is provided on the outer surface of the nozzle tip 40. The conducting wire 48 is electrically connected to the nozzle tip 40 to neutralize the charges of the processing liquid passing through the inside of the nozzle tip 40. Also, as illustrated in FIG. 3D, the conducting wire 48 includes a metal wire (copper wire) 48a and a chemical resistant protection layer 48b configured to protect the metal wire against the processing liquid.

The conducting wire 48 is connected directly to the nozzle tip 40 and extended along the line 30A and also grounded at a desired grounding position 60.

Further, as illustrated in FIG. 3A, the conductor 50 is provided at the base end side of the line 30A of the nozzle unit 30. The conductor 50 contains, for example, carbon and is formed of PTFE (polytetrafluoroethene) wholly having conductivity. In this case, both the second layer 32 and the third layer 33 of the line 30A are extended to the base end side to end within the conductor 50. Therefore, the first layer 31 is exposed to the outside within the conductor 50, and the outer surface of the first layer 31 having conductivity is electrically connected to the conductor 50.

Also, the third layer 33 is extended to the left side of the mounting member 50a to end within the conductor 50, and, thus, the second layer 32 is exposed within the conductor 50 to be electrically connected to the conductor 50. Further, the second layer 32 is extended to the right side of the mounting member 50a to end within the conductor 50.

Further, the first layer 31 of the line 30A penetrates the conductor 50 to be extended toward the base end side (toward the right side in FIG. 3A) of the line 30A, and the connector 51 is mounted on the first layer 31. The connector 51 is formed of, for example, the PFA material having conductivity. Specifically, the connector 51 may have conductivity on the inner surface and the outer surface, and may be formed using, for example, the AS type PFA tube as illustrated in FIG. 5B or the PTFE tube containing carbon and wholly having conductivity. Meanwhile, a communication tube 52 which has the same structure as the first layer 31 having conductivity is provided within the nozzle support 25. The communication tube 52 is formed of the NE type PFA tube having conductivity on the outer surface. Further, the communication tube 52 and the first layer 31 are clamped with each other from the outside by the connector 51 having conductivity on the inner surface and the outer surface, so that, the inside of the first layer 31 can communicate with the inside of the communication tube 52. In this case, the first layer 31 is electrically connected to the communication tube 52 via the connector 51. The communication tube 52 within the nozzle support 25 configured as described above is grounded via a non-illustrated conducting line.

Further, as illustrated in FIG. 3B, at the tip end side of the line 30A, the third layer 33 completely covers the first layer 31 and the second layer 32 from the outside and partly covers the nozzle tip 40 from the outside. The third layer 33 has high chemical resistance and heat resistance and thus can effectively protect the first layer 31, the second layer 32 and the nozzle tip 40 against the processing liquid including, for example, high temperature SPM.

Hereinafter, an operation of the present exemplary embodiment with the above-described configuration will be described.

First, as illustrated in FIG. 2, a wafer W within the processing unit (substrate processing apparatus according to the present disclosure) 16 is held by the substrate holding mechanism 22. Then, the wafer W held by the substrate holding mechanism 22 is rotated by the substrate holding mechanism 22, and a processing liquid, such as SPM, is discharged from the nozzle tip 40 of the nozzle unit 30 toward the wafer W while the wafer W is being rotated.

In this time, the processing liquid which is scattered to the outside from the wafer W by a centrifugal force generated when the substrate holding mechanism 22 is rotated is received and collected by the recovery cup 23.

It is assumed that the processing liquid has charges while being discharged from the nozzle tip 40 of the nozzle unit 30 toward the wafer W.

According to the present exemplary embodiment, the inner surface of the nozzle tip 40 has conductivity, and, thus, the charges in the processing liquid passing through the nozzle tip 40 is discharged to the inner surface of the nozzle tip 40.

Then, the charges discharged to the inner surface of the nozzle tip 40 are discharged to the outside through the following three electrical conduction routes (1) to (3) to be neutralized appropriately.

(1) The charges discharged to the conductive inner surface of the nozzle tip 40 flow to the conductive outer surface of the nozzle tip 40, and then, flow from the outer surface of the nozzle tip 40 to the conductor 50 through the second layer 32. Then, the charges flowed to the conductor 50 reach the outer surface of the first layer 31, and then, flow from the nozzle support 25 to the outside through the connector 51 to be grounded. As such, the charges in the processing liquid are neutralized appropriately.

(2) The charges discharged to the conductive inner surface of the nozzle tip 40 flow to the conductive outer surface of the nozzle tip 40. Then, the charges flow from the outer surface of the nozzle tip 40 to the conductive outer surface of the first layer 31, and then, reach the connector 51. Then, the charges flow from the nozzle support 25 to the outside to be grounded. As such, the charges in the processing liquid are neutralized appropriately.

(3) The charges discharged to the conductive inner surface of the nozzle tip 40 flow to the conductive outer surface of the nozzle tip 40. Then, the charges flow from the outer surface of the nozzle tip 40 through the conducting wire 48 to be grounded at the desired grounding position 60. As such, the charges in the processing liquid are neutralized appropriately.

As described above, according to the present exemplary embodiment, the charges in the processing liquid passing through the nozzle tip 40 are discharged to the inner surface of the nozzle tip 40 and then can be grounded to the outside. Thus, the charges in the processing liquid can be neutralized appropriately.

Also, at the tip end side of the line 30A, the third layer 33 having high chemical resistance and heat resistance can completely cover the first layer 31 and the second layer 32 and partly cover the nozzle tip 40. Thus, it is possible to effectively and securely protect the first layer 31, the second layer 32 and the nozzle tip 40 against the processing liquid including high temperature SPM.

Also, the conductive nozzle tip 40 is inserted into the tip end of the line 30A, and, thus, it is possible to easily and simply manufacture the line 30A and the nozzle unit 30 having the conductive nozzle tip 40 provided at the tip end of the line 30A. In this way, the substrate processing apparatus can be obtained.

Further, the nozzle tip 40 is joined to the first layer 31 by welding and also joined to the third layer 33 by welding. For this reason, the nozzle tip 40 can be joined to the first layer 31 and the third layer 33 of the line 30A, and, thus, the nozzle tip 40 can be stably fixed to the tip end of the line 30A.

Also, the charges in the processing liquid passing through the nozzle tip 40 can be discharged to the inner surface of the nozzle tip 40, and then, discharged to the outside through the above-described three electrical conduction routes (1) to (3). For this reason, the charges in the processing liquid can be rapidly and securely neutralized, compared to a case where the charges on the inner surface of the nozzle tip 40 are discharged to the outside through, for example, only one route.

Modification Example of Present Disclosure

Hereinafter, a modification example of the present disclosure will be described with reference to FIG. 6. In the above-described exemplary embodiment, there has been described the example where the nozzle tip 40 provided as a separate body from the line 30A is inserted into the tip end of the line 30A of the nozzle unit 30, but the present disclosure is not limited thereto. The first layer 31 of the line 30A may be further extended to the tip end side to form an extension portion 46, and a cover portion 47 covering the extension portion 46 from the outside may be provided around the extension portion 46. Thus, the nozzle tip 40 may be formed by the extension portion 46 and the cover portion 47.

Specifically, the first layer 31 of the line 30A may be formed using a thermoplastic material having chemical resistance against the SPM and heat resistance, for example, a PFA (tetrafluoroethylene perfluoroalkylvinylether) tube having conductivity. In this case, the first layer 31 of the line 30A may be formed using the AS type PFA tube having conductivity on the inner surface and the outer surface (see FIG. 5B). Also, the first layer 31 may be formed using a PFA tube including a CNT (Carbon Nano Tube) and thus may entirely have conductivity.

Also, the second layer 32 may be formed using an SUS (stainless steel) tube functioning as a frame for maintaining the rigidity of the line 30A and having conductivity.

Further, the third layer 33 may be formed using a thermoplastic material having chemical resistance against the SPM and heat resistance, for example, the PFA tube.

As such, the first layer 31 of the line 30A has conductivity on the inner surface and the outer surface to be extended toward the base end side of the line 30A to form the extension portion 46. Also, the cover portion 47 covering the extension portion 46 is formed of the PFA material and contains carbon. The nozzle tip 40 is formed by the extension portion 46 having conductivity on the inner surface and the outer surface and the cover portion 47.

Figure 6:
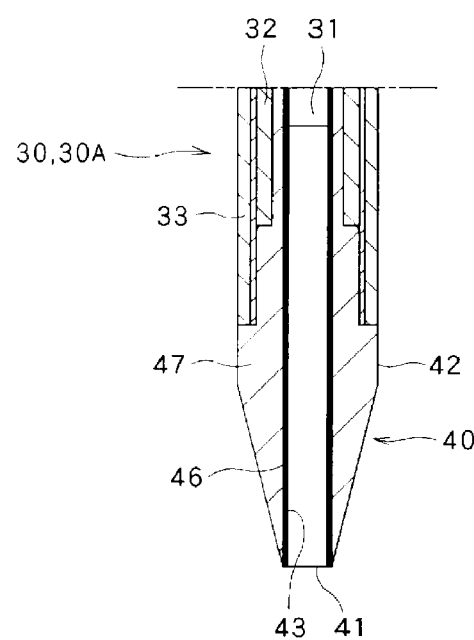
FIG. 6 is a side cross-sectional view illustrating a nozzle unit according to a modification example.

In FIG. 6, the charges in the processing liquid passing through the nozzle tip 40 flow from the inner surface of the extension portion 46 to the outer surface thereof having conductivity and then, the charges reaching the outer surface of the extension portion 46 reach the outer surface of the cover portion 47 containing carbon.

In the exemplary embodiment illustrated in FIG. 1 to FIG. 5B, there has been described the example where the nozzle tip 40 is formed of the AS type PFA material and has conductivity on the inner surface and the outer surface, but the present disclosure is not limited thereto. The nozzle tip 40 may be formed of the PFA material containing carbon so that the entire nozzle tip 40 including the inner surface and the outer surface may have conductivity.

Also, in the exemplary embodiment illustrated in FIG. 1 to FIG. 5B and in the modification example illustrated in FIG. 6, there has been described the example where the SUS tube is used as the second layer 32, but the present disclosure is not limited thereto. A hard resin having conductivity may be used as the second layer 32. Further, a ceramic material may be used as the second layer 32.

The exemplary embodiment and modification example can be appropriately combined as long as they are not contradictory to each other.

According to the present disclosure, the nozzle unit has the sufficient corrosion resistance against the processing liquid to be discharged and the electric charging of the processing liquid to be discharged from the nozzle unit can be securely suppressed.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing apparatus comprising a substrate holder configured to hold a target substrate; and a nozzle unit configured to discharge a processing liquid to the target substrate held by the substrate holder,
   wherein the nozzle unit includes a line through which the processing liquid is supplied and a nozzle tip provided on a tip end of the line and configured to discharge the processing liquid toward the target substrate,
   the line includes a first layer formed of a corrosion resistant resin, a second layer formed of a rigid material and a third layer formed of a corrosion resistant resin which are arranged in sequence from an inside thereof,
   the nozzle tip is formed of a corrosion resistant resin having conductivity, and
   the third layer is configured to cover the first layer and the second layer from outside and cover a part of the nozzle tip from outside,
   wherein the nozzle tip is inserted into the line and provided as a separate body from the line,
   wherein a tip end of the third layer is further extended toward a tip end of the nozzle tip as compared to a tip end of the second layer, and
   the tip end of the second layer is further extended toward the tip end of the nozzle tip as compared to a tip end of the first layer.

2. The substrate processing apparatus of claim 1, wherein the nozzle tip is connected to a conducting wire.

3. The substrate processing apparatus of claim 1, wherein the nozzle tip is welded to the first layer and the third layer.

4. The substrate processing apparatus of claim 1, wherein the first layer is formed of a PFA tube having conductivity.

5. The substrate processing apparatus of claim 1, wherein the second layer is formed of an SUS tube.

6. The substrate processing apparatus of claim 1, wherein the third layer is formed of a PFA tube.

7. The substrate processing apparatus of claim 1, wherein the nozzle tip is formed of a PFA material having conductivity.

8. The substrate processing apparatus of claim 1,
wherein the nozzle tip includes an extension portion of the first layer of the line and a cover portion covering the extension portion from outside.

9. The substrate processing apparatus of claim 1,
wherein the first layer has conductivity and the first layer and the nozzle tip are joined to each other, or the second layer has conductivity and the second layer and the nozzle tip are joined to each other.

10. A manufacturing method of a substrate processing apparatus including a substrate holder configured to hold a target substrate and a nozzle unit configured to discharge a processing liquid to the target substrate held by the substrate holder, the manufacturing method comprising:

preparing a line, including a first layer formed of a corrosion resistant resin, a second layer formed of a rigid material and a third layer formed of a corrosion resistant resin which are arranged in sequence from an inside thereof, through which the processing liquid is supplied;

preparing a nozzle tip formed of a corrosion resistant resin having conductivity and configured to discharge the processing liquid toward the target substrate; and inserting the nozzle tip into a tip end of the line, wherein the third layer is configured to cover the first layer and the second layer from outside and cover a part of the nozzle tip from outside, wherein the nozzle tip is provided as a separate body from the line, wherein a tip end of the third layer is further extended toward a tip end of the nozzle tip as compared to a tip end of the second layer, and the tip end of the second layer is further extended toward the tip end of the nozzle tip as compared to a tip end of the first layer.

* * * * *